United States Patent [19]

Akiba et al.

[11] Patent Number: 4,633,474
[45] Date of Patent: Dec. 30, 1986

[54] DISTRIBUTED FEEDBACK SEMICONDUCTOR LASER

[75] Inventors: Shigeyuki Akiba, Tokyo; Katsuyuki Utaka, Musashino; Kazuo Sakai, Tokyo; Yuichi Matsushima, Tanashi, all of Japan

[73] Assignee: Kokusai Denshin Denwa Kabushiki Kaisha, Tokyo, Japan

[21] Appl. No.: 678,244

[22] Filed: Dec. 5, 1984

[30] Foreign Application Priority Data

Dec. 9, 1983 [JP] Japan .................. 58-231356

[51] Int. Cl.[4] ........................................... H01S 3/19
[52] U.S. Cl. ............................... 372/19; 357/17; 372/46; 372/50; 372/96
[58] Field of Search .............. 372/96, 45, 46, 50, 372/19; 357/17

[56] References Cited

PUBLICATIONS

Utaka et al, "Room-Temperature CW Operation of Distributed-Feedback Buried-Heterostructure In-GaAsP/InP Lasers Emitting at 1.57 μm", *Electronics Letters*, vol. 17, No. 25, Dec. 10, 1981, pp. 961–963.

*Primary Examiner*—James W. Davie
*Attorney, Agent, or Firm*—Robert E. Burns; Emmanuel J. Lobato; Bruce L. Adams

[57] ABSTRACT

A distributed feedback semiconductor laser which has periodic corrugations formed in a layer adjoining a light emitting layer so as to extend in the direction of travel of light and performs laser oscillation by the injection of current into the light emitting layer, in which a part of at least one metal electrode has a TM mode suppressing region disposed at a position where light is essentially distributed in the thickwise direction of the laser. A window region formed of a semiconductor larger in energy gap than the light emitting layer is disposed at both ends of the laser oscillation region in the direction of travel of light, the length of the window region being limited so that no substantial reflection occurs therein.

2 Claims, 6 Drawing Figures

DISTRIBUTED FEEDBACK SEMICONDUCTOR LASER

BACKGROUND OF THE INVENTION

The present invention relates to improvements in a distributed feedback semiconductor laser (hereinafter referred to simply as the "DFB laser").

The DFB laser is now being developed for its application, as a high performance light source of a single-wavelength operation, to low-loss optical fiber communications. However, the conventional DFB laser has a defect such that simultaneous oscillation in the TE mode and the TM mode is occasionally generated as mentioned thereafter.

SUMMARY OF THE INVENTION

It is an object of the present invention to provide a DFB laser which is intended to overcome the abovesaid defects of the prior art and in which selective losses are inflicted on the TM mode and an equivalent refractive index of the laser region is partly varied, thereby permitting a stable single-wavelength oscillation in the TE mode.

In accordance with one feature of the present invention, there is provided a distributed feedback semiconductor laser which has periodic corrugations formed in a layer adjoining a light emitting layer so as to extend in the direction of travel of light and performs laser oscillation by the injection of current into the light emitting layer, characterized in that a part of at least one metal electrode has a TM mode suppressing region disposed at a position where light is essentially distributed in the thickwise direction of the laser.

In accordance with another feature of the present invention, a window region formed of a semiconductor larger in energy gap than the light emitting layer is disposed at both ends of the laser oscillation region in the direction of travel of light, the length of the window region being limited so that no substantial reflection occurs therein.

BRIEF DESCRIPTION OF THE DRAWINGS

The present invention will be described in detail below in comparison with conventional art with reference to the accompanying drawings, in which.

DETAILED DESCRIPTION

To make differences between the prior art and the present invention clear, an example of the prior art will first be described.

Figure 1:
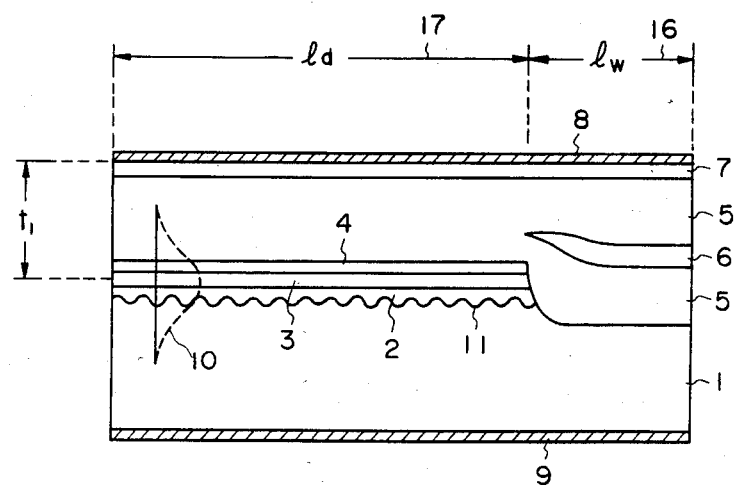
FIG. 1 is a longitudinal-sectional view of a typical DFB laser heretofore employed.

FIG. 1 is a sectional view along the direction of travel of light, illustrating an example of a conventional DFB laser. The illustrated example employs InP for the substrate and a material of the InGaAsP alloys which is lattice-matched to InP. An n-type InGaAsP waveguide layer 2, an InGaAsP light emitting layer 3, a p-type InGaAsP buffer layer 4, a p-type InP clad layer 5 and a p-type InGaAsP cap layer 7 are laminated on an n-type InP substrate 1, and electrodes 8 and 9 are disposed on the top surface and the bottom surface of the wafer. The waveguide layer 2 has formed therein periodic corrugations 11 in the direction of travel of light, and an injection of current into the light emitting layer 3 will produce the laser oscillation. On one of the extension lines of a laser oscillation region 17 (whose length is identified by $l_d$) in which the light emitting layer 3 exists, there is disposed a window region 16 (whose length is identified by $l_w$) which is made up of the p-type InP layer 5 and an n-type InP layer 6. Since the window region 16 has no waveguide function, the Fabry-Perot mode oscillation by reflection at both end faces is appreciably restricted. Because of such an asymmetrical structure that has a reflectivity of about 30% at the left-hand end where the laser oscillation region 17 including the light emitting layer 3 is disposed but the window region 16 is not provided, and an extremely low reflectivity at the right-hand end where the window region 16 is disposed, only the DFB mode by the periodic corrugations 11 assumes a low oscillation threshold value, facilitating the occurrence of a single-wavelength oscillation.

On the other hand, the DFB laser has two planes of polarization in the TE mode and the TM mode. Since the oscillation wavelength in the TM mode is usually shorter than that in the TE mode by about 10 to 100 Å, simultaneous oscillation in the TE mode and the TM mode will make the laser entirely useless as a single-wavelength light source. Incidentally, the TE mode is established by an electric field component perpendicular to the plane of the paper and the TM mode by a magnetic field component similarly perpendicular to the plane of the paper. Usually, the TE mode is larger both in the coupling efficient by the periodic corrugations 11 and in the coefficient of confinement of light in the light emitting layer 3 than the TM mode, so that strictly speaking, the TE mode is the lowest oscillation threshold mode, but since a difference between its oscillation threshold value and that of the TM mode is very slight, the TM mode also develops occasionally.

In a structure that has been proposed, as a solution to this defect, for selectively inflicting losses on the TM mode, the thickness $t_1$ of the wafer from the light emitting layer 3 to the upper metal electrode 8 is reduced so that the upper metal electrode 8 is disposed at the position where light is essentially distributed, as indicated by the light intensity distribution 10. With this structure, however, such an arrangement of the upper electrode 8 inflicts nonnegligible losses on the TE mode as well and presents a problem such as the influence of distortion which is exerted an occational application of a pressure to the light emitting layer 3 during the bonding operation, or adhesions to the light emitting layer 3 of bonding solder. Accordingly, it is not preferable to dispose the entire upper electrode 8 in the vicinity of the light emitting layer 3.

With reference to the accompanying drawings, the present invention will hereinafter be described in detail.

Figure 2:
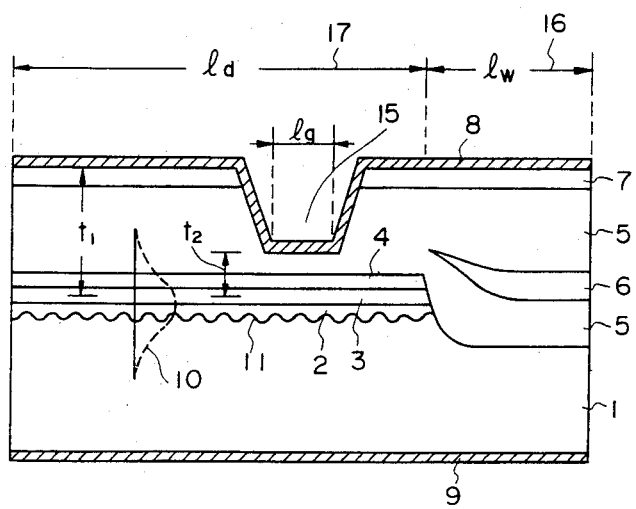
FIGS. 2, 3, 4, 5A and 5B are longitudinal-sectional views of embodiments of the present invention.

FIG. 2 is a cross-sectional view alone the direction of travel of light, illustrating an embodiment of the present invention. This embodiment has a structure in which a TM mode suppressing region 15, whose thickness $t_1$ is selected to be $t_2$ (where $t_2 < t_1$) and whose length is $l_g$ is provided in such a region as indicated by the light intensity distribution 10 in which light is essentially distributed in the thick-wise direction of the wafer. The TM mode suppressing region 15 can be disposed at an arbitrary position in the laser oscillation region 17. By approaching a portion of the upper electrode 8 to the position ($t_2$) where light is essentially distributed, as shown, it is possible to selectively inflict losses on the TM mode alone without exerting any appreciable influence on the TE mode. This ensures a stable single-wavelength oscillation in the TE mode alone and permits bonding at the portion of the thickness $t_1$ as in the case of the conventional DFB laser, eliminating the aforementioned undesirable influence on the fabrication of the device during the bonding operation.

Figure 3:
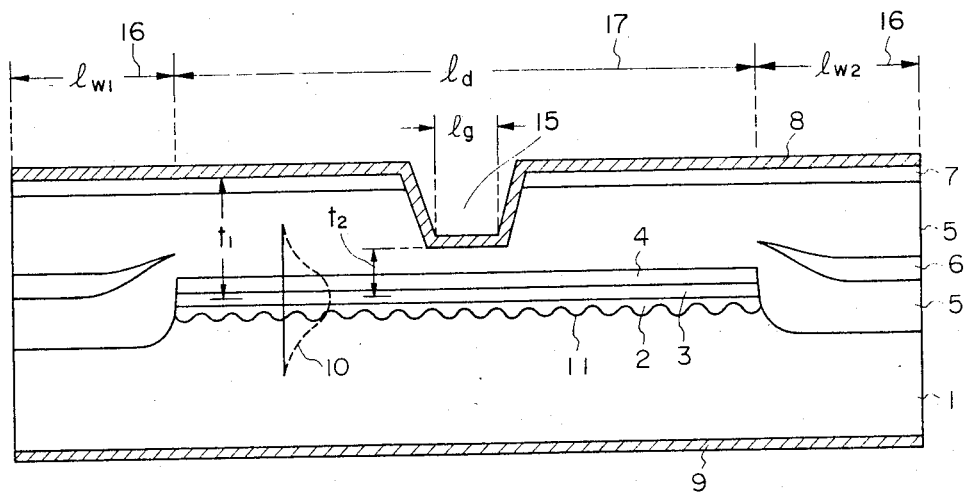

FIG. 3 illustrates another embodiment of the present invention, which has a structure in which a part of the upper metal electrode 8 forms the TM mode suppressing region 15 (whose length is $l_g$) disposed substantially at the center of the laser oscillation region 17 and at the position $t_2$ where light is essentially distributed, and window regions 16 of lengths $l_{w1}$ and $l_{w2}$ are respectively disposed at both sides of the laser oscillation region 17 in its lengthwise direction. In this case, the lengths $l_{w1}$ and $l_{w2}$ of the window regions 16 are limited so that oscillation light emitted from the both ends of the laser oscillation region 17 are not substantially reflected by the upper electrode 8 and so forth in the window regions.

Incidentally, it is known that a conventional DFB laser of a structure, in which window region are provided at both ends of the laser oscillation region and the reflectivity of the laser oscillation region is almost negligible, basically oscillates at two wavelengths at the same time unless a phase inverting region is provided in the neighborhood of the central portion of the periodic irregularities 11. This two-wavelength oscillation is caused by a homogeneous laminate structure of the laser oscillation region; conventionally, as referred to previously, an about 180-degree phase inverting region is provided near the center of the periodic irregularities 11, producing a single-wavelength oscillation. In contrast thereto, according to the present invention, a part of the upper electrode 8 (of the length $l_g$) is disposed at the position $t_2$ where light is essentially distributed, by which the equivalent refractive index of the TM mode suppressing region 15 of the length $l_g$ undergoes slight variations, causing the laser oscillation region 17 to have a nonhomogeneous laminate structure. This prevents the two-wavelength oscillation unlike in the case of the homogeneous laminate structure and facilitates the single-wavelength operation. Moreover, by disposing the TM mode suppressing region 15 of the length $l_g$ substantially at the center of the laser oscillation region 17 so that the propagation phase difference of light caused by the variations in the equivalent refractive index of the suppressing region is approximately 90 degrees, a very stable single-wavelength oscillation can be obtained and the TM mode is also suppressed as described previously.

Figure 4:
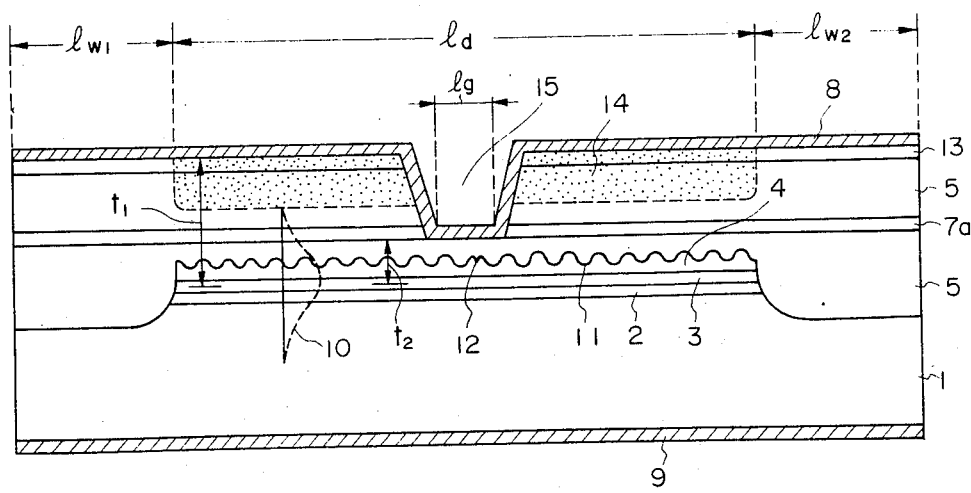

FIG. 4 illustrates another embodiment of the present invention, in which the periodic corrugations 11 are formed in the buffer layer 4 and a phase inverting region 12 for changing the phase of the corrugations through approximately 180 degrees (about 90 degrees in terms of the propagation phase of light on the assumption of a primary diffraction grating) is provided near the center of the corrugations. Furthermore, for obtaining the thickness $t_2$ with good controlability by selective etching, a p-type InGaAsP layer 7a is disposed between the upper electrode 8 and the buffer layer 4, and further, a cap layer 13 is formed by an n-type InGaAsP layer and a zinc diffused region 14 is formed as a current path. As described above, by providing the TM mode suppressing region 15 of the length $l_g$, according to the present invention, in the conventional DFB laser which has the phase inverting region 12 in the periodic corrugations 11, an extremely stable single-wavelength oscillation can be achieved even if the variations in the equivalent refractive index of the TM mode suppressing region 15 of the length $l_g$ are very small.

Figure 5A:
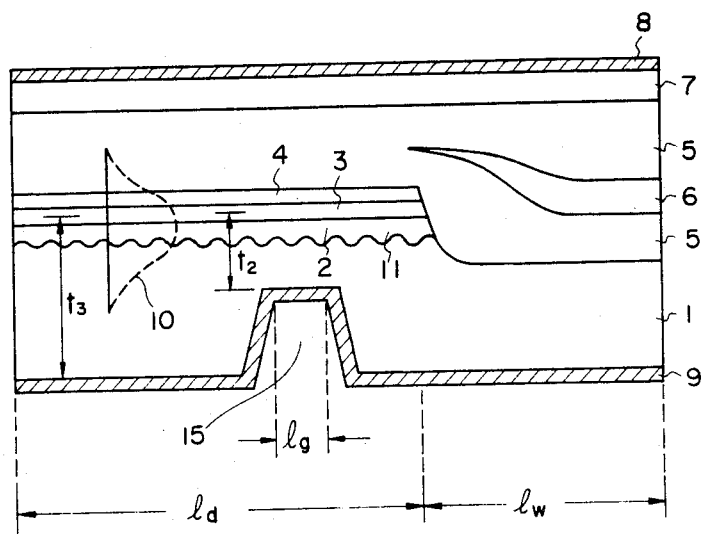
Figure 5B:
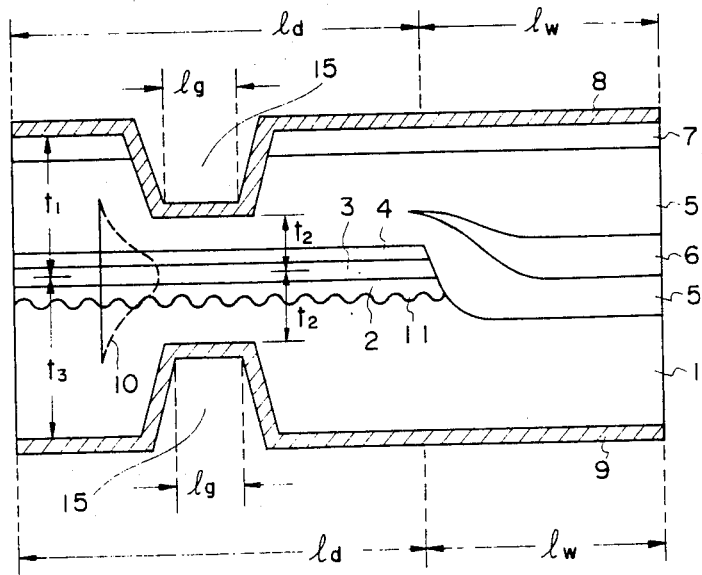

While the foregoing embodiments have all been described in connection with the DFB laser of the type in which a part of the upper metal electrode 8 is disposed at the position $t_2$ where light is essentially distributed, thereby to constitute the TM mode suppressing region, the same results can also be obtained by providing the TM mode suppressing region 15 of the length $l_g$ at the lower metal electrode 9, as shown in FIG. 5A, or at each of the upper and lower metal electrodes 8 and 9, as shown in FIG. 5B.

Although in the foregoing description no reference has been made to a stripe structure for stabilizing a lateral mode, the present invention is applicable to a buried heterostructure, a plano-convex waveguide structure and various other stripe structures. Besides, the present invention is also applicable not only to the materials of the InGaAsP/InP alloys but also to other semiconductor materials of the InAlGaAs/InP, AlGaAs/GaAs alloys and so forth.

As has been described in the foregoing in detail, the distributed feedback semiconductor laser of the present invention achieves a true single-wavelength operation including the plane of polarization since the TM mode is effectively suppressed, and is of great utility as a high performance light source for low-loss optical fiber communications.

What we claim is:

1. In a distributed feedback semiconductor laser having a light emitting layer, a semiconductor layer adjoining the light emitting layer having periodic corrugations extending in a direction of travel of light in the light emitting layer, metal electrodes on opposite sides of the semiconductor for injection of electrical current into said light emitting layer for performing of laser oscillation in the light emitting layer, wherein the improvement comprises a part of at least one of the metal electrodes being disposed in a position relative to a region of the semiconductor laser where light is essentially distributed in the thickness direction of the laser and effectively developing a TM mode suppression.

2. In a distributed feedback semiconductor laser having a light emitting layer, a semiconductor layer adjoining the light emitting layer having periodic corrugations extending in the direction of travel of light in the light emitting layer, metal electrodes on opposite sides of the semiconductor for injection of electrical current into said light emitting layer for performing of laser oscillations in the light emitting layer, wherein the improvement comprises a part of at least one of the metal electrodes is disposed in a position relative to a region of the semiconductor laser where light is essentially distributed in the thickness direction of the laser effective to provide a TM mode suppressing region substantially in correspondence with a center of a laser oscillation region including the light emitting layer, a window region formed of a semiconductor larger in energy gap than the light emitting layer disposed both ends of said laser oscillation region in the direction of travel of light, and the length of said window region being limited so that no substantial reflection occurs therein.

* * * * *